United States Patent
Chae (10) Patent No.: US 10,109,338 B2
(45) Date of Patent: Oct. 23, 2018

(54) SEMICONDUCTOR DEVICES AND SEMICONDUCTOR SYSTEMS GENERATING INTERNAL ADDRESS

(71) Applicant: SK hynix Inc., Icheon-si, Gyeonggi-do (KR)

(72) Inventor: Haeng Seon Chae, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 500 days.

(21) Appl. No.: 14/851,275

(22) Filed: Sep. 11, 2015

(65) Prior Publication Data

US 2016/0372178 A1    Dec. 22, 2016

(30) Foreign Application Priority Data

Jun. 17, 2015  (KR) ........................ 10-2015-0085765

(51) Int. Cl.
*G11C 11/406*    (2006.01)
*G11C 11/408*    (2006.01)

(52) U.S. Cl.
CPC ...... *G11C 11/40607* (2013.01); *G11C 11/408* (2013.01); *G11C 2211/4067* (2013.01)

(58) Field of Classification Search
CPC .......... G11C 2211/4067; G11C 11/408; G11C 11/40607
See application file for complete search history.

(56) References Cited

U.S. PATENT DOCUMENTS

| 2009/0084941 | A1  | 4/2009  | Muramatsu et al. |
| 2014/0369106 | A1* | 12/2014 | Hwang ................. G11C 17/18 365/96 |
| 2015/0036440 | A1* | 2/2015  | Kim .................. G11C 11/40618 365/189.05 |

FOREIGN PATENT DOCUMENTS

KR    1019990012253 A    2/1999

* cited by examiner

*Primary Examiner* — Larry T Mackall
(74) *Attorney, Agent, or Firm* — William Park & Associates Ltd.

(57) ABSTRACT

A semiconductor system includes a controller and a semiconductor device. The controller outputs pre-order address signals, post-order address signals, and an update signal including pulses periodically generated. The semiconductor device generates internal address signals counted by a predetermined number of times according to a combination of the pre-order address signals and a combination of the post-order address signals in response to a pulse of the update signal. The semiconductor device also performs a refresh operation according to a combination of the internal address signals.

31 Claims, 6 Drawing Sheets

SEMICONDUCTOR DEVICES AND SEMICONDUCTOR SYSTEMS GENERATING INTERNAL ADDRESS

CROSS-REFERENCE TO RELATED APPLICATIONS

The present application claims priority under 35 U.S.C 119(a) to Korean Application No. 10-2015-0085765, filed on Jun. 17, 2015, in the Korean Intellectual Property Office, which is incorporated herein by reference in its entirety as set forth in full.

BACKGROUND

1. Technical Field

Embodiments of the invention relate to semiconductor devices and semiconductor systems including the same.

2. Related Art

In the electronics industry, highly integrated fast volatile memory devices such as high performance dynamic random access memory (DRAM) devices widely used as memory devices are increasingly in demand with the development of high performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of effort has been focused on reduction of an operation current and a standby current of the semiconductor devices.

Recently, an array of the e-fuses has been proposed to reduce an area occupied by the e-fuses that store information necessary for various internal control operations. In such a case, the integration density of the semiconductor devices may be improved.

SUMMARY

According to an embodiment, a semiconductor device includes a code signal generating unit and an internal address generating unit. The code signal generating unit outputs code signals generated from pre-order address signals and outputs again the code signals if a combination of post-order address signals is a same combination as internal address signals. The internal address generating unit generates the internal address signals initialized to have a first combination according to a combination of the code signals and counted from the first combination by a predetermined number of times in response to a pulse of an update signal.

According to an embodiment, a semiconductor system includes a controller and a semiconductor device. The controller outputs pre-order address signals, post-order address signals, and an update signal including pulses which are periodically generated. The semiconductor device generates internal address signals counted by a predetermined number of times according to a combination of the pre-order address signals and a combination of the post-order address signals in response to a pulse of the update signal. The semiconductor device also performs a refresh operation according to a combination of the internal address signals.

According to an embodiment, a semiconductor system includes a controller and a semiconductor device. The controller outputs pre-order address signals, post-order address signals, and an update signal having pulses which are periodically generated and suitable for receiving fuse data. The semiconductor device generates internal address signals which are counted by a predetermined number of times according to a combination of the pre-order address signals and a combination of the post-order address signals in response to a pulse of the update signal. The semiconductor device also outputs the fuse data according to a combination of the internal address signals.

DETAILED DESCRIPTION

Various embodiments of the invention will be described hereinafter with reference to the accompanying figures. However, the embodiments described herein are for illustrative purposes only and are not intended to limit the scope of the invention.

Figure 1:
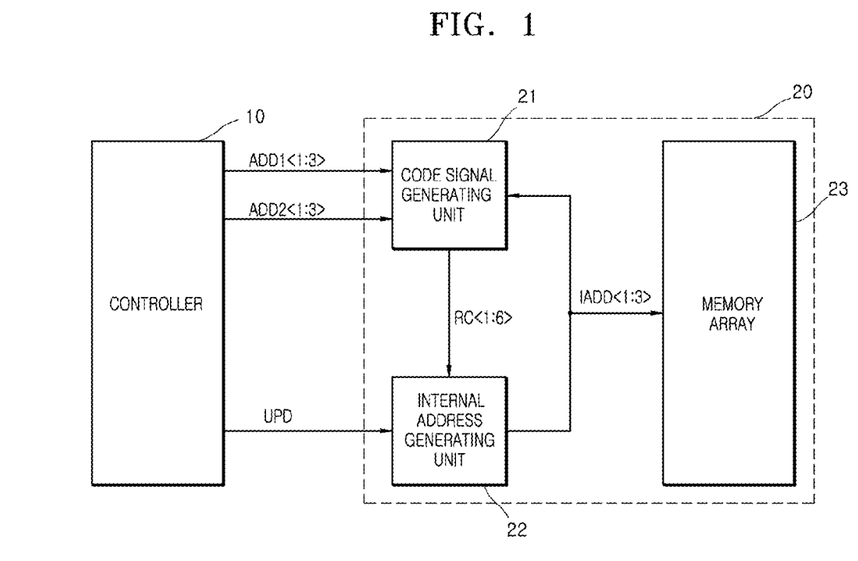
FIG. 1 is a block diagram illustrating a configuration of a semiconductor system according to an embodiment.

Referring to FIG. 1, a semiconductor system according to an embodiment may include a controller 10 and a semiconductor device 20. The semiconductor device 20 may include a code signal generating unit 21, an internal address generating unit 22, and a memory array 23.

The controller 10 may output first to third pre-order address signals ADD1<1:3> and first to third post-order address signals ADD2<1:3>. The controller 10 may also output an update signal UPD including pulses which are periodically generated. Although an embodiment is described in conjunction with an example in which the first to third pre-order address signals ADD1<1:3> are set to have three bits and the first to third post-order address signals ADD2<1:3> are set to have three bits, but the invention is not limited thereto. In addition, although FIG. 1 illustrates an example in which the first to third pre-order address signals ADD1<1:3> and the first to third post-order address signals ADD2<1:3> are separately outputted from the controller 10 through different input/output (I/O) pins, but the invention is not limited thereto. For example, the controller 10 may be designed so that the first to third pre-order address signals ADD1<1:3> and the first to third post-order address signals ADD2<1:3> are outputted in series through the same I/O pin.

The code signal generating unit 21 may output first to sixth code signals RC<1:6> generated from the first to third pre-order address signals ADD1<1:3>. The code signal generating unit 21 may output the first to sixth code signals RC<1:6> again if a combination of the first to third post-order address signals ADD2<1:3> is the same as a combination of first to third internal address signals IADD<1:3>. The first to third internal address signals IADD<1:3> may have the same combination as the pre-order address signals ADD1<1:3>.

The internal address generating unit 22 may generate the first to third internal address signals IADD<1:3> which are initialized to have a first combination according to a combination of the first to sixth code signals RC<1:6> and which are counted by a predetermined number of times in response to the update signal UPD.

The memory array 23 may include a plurality of memory cells. Some of the memory cells may be selected by the first to third internal address signals IADD<1:3>. Further, the selected memory cells may be refreshed by a refresh operation. The refresh operation means an operation that data stored in the memory cells are periodically sensed and amplified according to a data retention characteristic of the memory cells.

Figure 2:
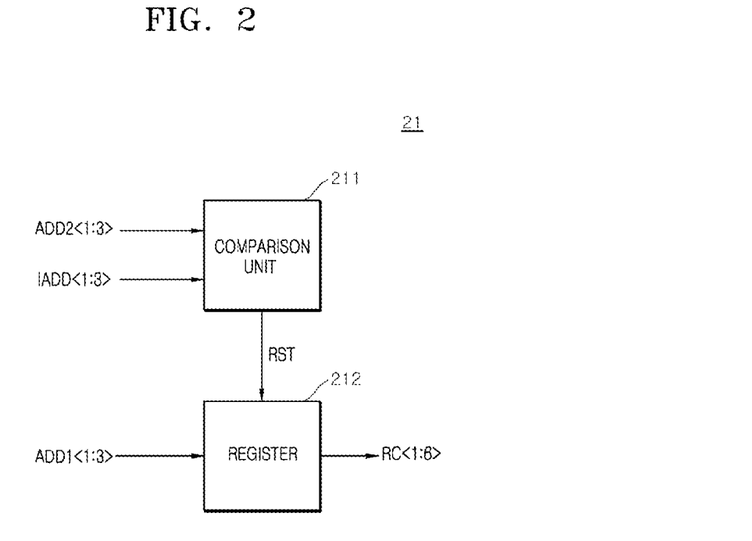
FIG. 2 is a block diagram illustrating a configuration of a code signal generating unit included in the semiconductor system of FIG. 1.

Referring to FIG. 2, the code signal generating unit 21 may include a comparison unit 211 and a register 212.

The comparison unit 211 may generate a reset signal RST which is enabled if the combination of the first to third post-order address signals ADD2<1:3> is the same as the combination of the first to third internal address signals IADD<1:3>.

The register 212 may store the first to third pre-order address signals ADD1<1:3> therein and may output the first to sixth code signals RC<1:6> generated from the first to third pre-order address signals ADD1<1:3>. The register 212 may output again the first to sixth code signals RC<1:6> in response to the reset signal RST.

Hereinafter, various combinations of the first to sixth code signals RC<1:6>, which are generated from the first to third pre-order address signals ADD1<1:3>, will be described in more detail.

If the first pre-order address signal ADD1<1> is a logic low level, the first code signal RC<1> may be generated to have a logic high level and the second code signal RC<2> may be generated to have a logic low level.

If the first pre-order address signal ADD1<1> is a logic high level, the first code signal RC<1> may be generated to have a logic low level and the second code signal RC<2> may be generated to have a logic high level.

If the second pre-order address signal ADD1<2> is a logic low level, the third code signal RC<3> may be generated to have a logic high level and the fourth code signal RC<4> may be generated to have a logic low level.

If the second pre-order address signal ADD1<2> is a logic high level, the third code signal RC<3> may be generated to have a logic low level and the fourth code signal RC<4> may be generated to have a logic high level.

If the third pre-order address signal ADD1<3> is a logic low level, the fifth code signal RC<5> may be generated to have a logic high level and the sixth code signal RC<6> may be generated to have a logic low level.

If the third pre-order address signal ADD1<3> is a logic high level, the fifth code signal RC<5> may be generated to have a logic low level and the sixth code signal RC<6> may be generated to have a logic high level.

Figure 3:
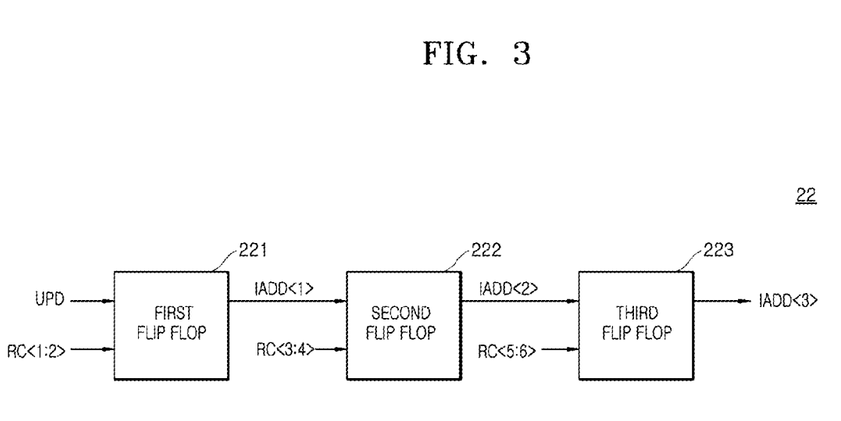
FIG. 3 is a block diagram illustrating a configuration of an internal address generating unit included in the semiconductor system of FIG. 1.

Referring to FIG. 3, the internal address generating unit 22 may include a first flip flop 221, a second flip flop 222, and a third flip flop 223.

The first flip flop 221 may generate the first internal address signal IADD<1> which is initialized according to the combination of the first and second code signals RC<1:2> and which is toggled in response to the update signal UPD. If the first code signal RC<1> is a logic high level and the second code signal RC<2> is a logic low level, the first internal address signal IADD<1> may be initialized to a logic low level. If the first code signal RC<1> is a logic low level and the second code signal RC<2> is a logic high level, the first internal address signal IADD<1> may be initialized to a logic high level.

The second flip flop 222 may generate the second internal address signal IADD<2> initialized according to the combination of the third and fourth code signals RC<3:4> and which is toggled in response to the first internal address signal IADD<1>. If the third code signal RC<3> is a logic high level and the fourth code signal RC<4> is a logic low level, the second internal address signal IADD<2> may be initialized to a logic low level. If the third code signal RC<3> is a logic low level and the fourth code signal RC<4> is a logic high level, the second internal address signal IADD<2> may be initialized to a logic high level.

The second flip flop 223 may generate the third internal address signal IADD<3> initialized according to the combination of the fifth and sixth code signals RC<5:6> and toggled in response to the second internal address signal IADD<2>. If the fifth code signal RC<5> is a logic high level and the sixth code signal RC<6> is a logic low level, the third internal address signal IADD<3> may be initialized to a logic low level. If the fifth code signal RC<5> is a logic low level and the sixth code signal RC<6> is a logic high level, the third internal address signal IADD<3> may be initialized to a logic high level.

Figure 4:
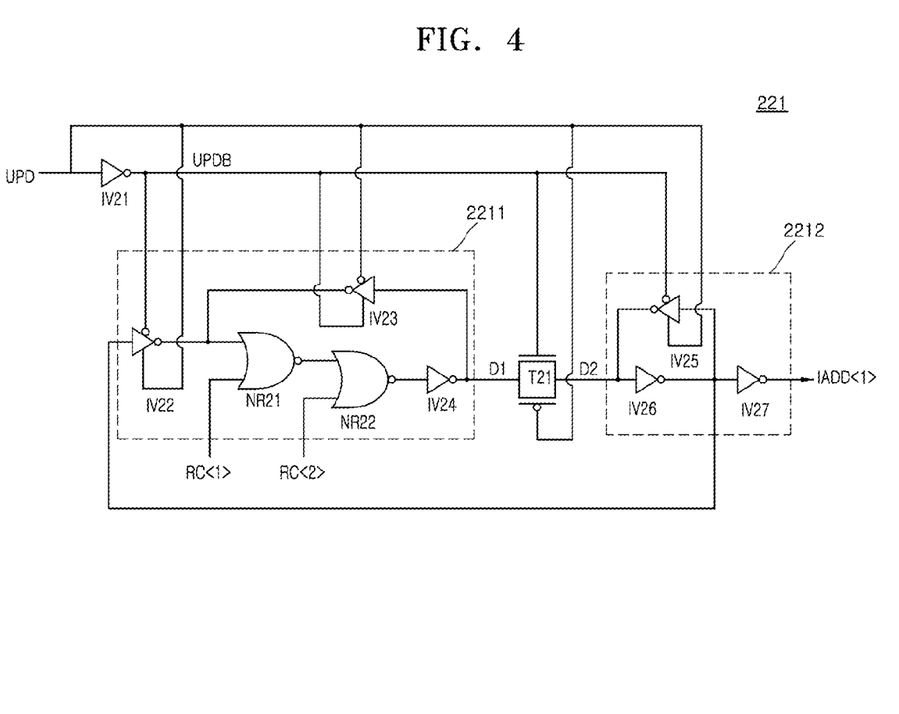
FIG. 4 is a circuit diagram illustrating a configuration of a first flip flop included in the internal address generating unit of FIG. 3.

Referring to FIG. 4, the first flip flop 221 may include an inverter IN21, a first buffer unit 2211, a first transfer unit T21, and a second buffer unit 2212.

The inverter IV21 may inversely buffer the update signal UPD to generate an inverted update signal UPDB.

The first buffer unit 2211 may include inverters IV22, IV23 and IV24 and NOR gates NR21 and NR22. The first buffer unit 2211 may receive the update signal UPD and the inverted update signal UPDB to generate a first delay signal D1 whose level is set according to the combination of the first and second code signals RC<1:2>. Each of the inverter IV22 and the inverter IV23 may be realized using a three-phase inverter that inversely buffers an input signal in response to the update signal UPD.

An operation of the first buffer unit 2211 generating the first delay signal D1 whose level is set according to the combination of the first and second code signals RC<1:2> will be described more fully hereinafter.

If the first code signal RC<1> is a logic high level and the second code signal RC<2> is a logic low level, the first buffer unit 2211 may generate the first delay signal D1 having a logic low level.

If the first code signal RC<1> is a logic low level and the second code signal RC<2> is a logic high level, the first buffer unit 2211 may generate the first delay signal D1 having a logic high level.

The first transfer unit T21 may be realized using a transfer gate and may output the first delay signal D1 as a second delay signal D2 in response to the update signal UPD.

The second buffer unit 2212 may be realized using inverters IV25, IV26 and IV27 and may latch and buffer the second delay signal D2 in response to the update signal UPD to generate the first internal address signal IADD<1>. The inverter IV24 may be realized using a three-phase inverter that inversely buffers an input signal in response to the update signal UPD.

Each of the second flip flop 222 and the third flip flop 223 illustrated in FIG. 3 may be realized to have substantially the same configuration as the first flip flop 221 illustrated in FIG. 4, except for input and output signals thereof. Thus, detailed descriptions of the second and third flip flops 222 and 223 will be omitted hereinafter.

Figure 5:
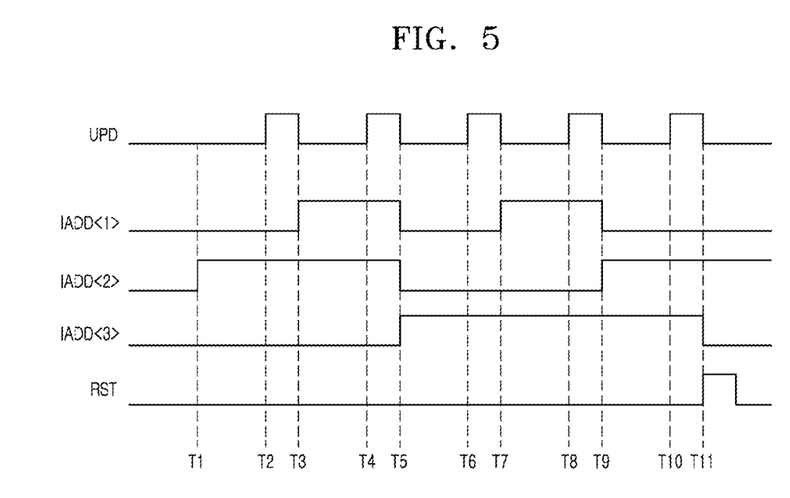
FIG. 5 is a timing diagram illustrating an operation of the semiconductor system according to an embodiment.

An operation of the semiconductor system according to an embodiment will be described hereinafter with reference to FIG. 5 in conjunction with an example in which a combination of the first to third pre-order address signals ADD1<1:3> has a first combination of 'L,H,L' and a combination of the first to third post-order address signals ADD2<1:3> has a second combination of 'H,H,L' during a refresh operation.

At a point of time T1, the controller 10 may output the first to third pre-order address signals ADD1<1:3> having the first combination of 'L,H,L' and the first to third post-order address signals ADD2<1:3> having the second combination of 'H,H,L.' The first combination 'L,H,L' the first to third pre-order address signals ADD1<1:3> means that the first, second and third pre-order address signals ADD1<1:3> have a logic low (L) level, a logic high (H) level, and a logic low (L) level, respectively. In addition, the second combination 'H,H,L' of the first to third post-order address signals ADD2<1:3> means that the first, second and third post-order address signals ADD2<1:3> have a logic low (L) level, a logic high (H) level, and a logic high (H) level, respectively.

The register 212 of the code signal generating unit 21 may output the first to sixth code signals RC<1:6> which are generated from the first to third pre-order address signals ADD1<1:3>.

The register 212 of the code signal generating unit 21 may output the first code signal RC<1> having a logic high level and the second code signal RC<2> having a logic low level because the first pre-order address signal ADD1<1> has a logic low level. In addition, the register 212 of the code signal generating unit 21 may output the third code signal RC<3> having a logic low level and the fourth code signal RC<4> having a logic high level because the second pre-order address signal ADD1<2> has a logic high level. Moreover, the register 212 of the code signal generating unit 21 may output the fifth code signal RC<5> having a logic high level and the sixth code signal RC<6> having a logic low level because the third pre-order address signal ADD1<3> has a logic low level.

The first flip flop 221 of the internal address generating unit 22 may receive the first code signal RC<1> having a logic high level and the second code signal RC<2> having a logic low level to generate the first internal address signal IADD<1> which is initialized to a logic low level.

The second flip flop 222 of the internal address generating unit 22 may receive the third code signal RC<3> having a logic low level and the fourth code signal RC<4> having a logic high level to generate the second internal address signal IADD<2> which is initialized to a logic high level.

The third flip flop 223 of the internal address generating unit 22 may receive the fifth code signal RC<5> having a logic high level and the sixth code signal RC<6> having a logic low level to generate the third internal address signal IADD<3> which is initialized to a logic low level.

As a result, the internal address generating unit 22 may generate the first to third internal address signals IADD<1:3> which are initialized to have the same combination as the first to third pre-order address signals ADD1<1:3> having the first combination, in response to the first to sixth code signals RC<1:6>.

At a point of time T2, the controller 10 may output the update signal UPD including a pulse that has a logic high level.

In such a case, the register 212 of the code signal generating unit 21 may output the first to sixth code signals RC<1:6>, all bits of which have a logic low level.

At a point of time T3, the first flip flop 221 of the internal address generating unit 22 may generate the first internal address signal IADD<1> whose level is changed from a logic low level to a logic high level in response to the update signal UPD having a logic low level.

The second flip flop 222 of the internal address generating unit 22 may generate the second internal address signal IADD<2> having a logic high level in response to the first internal address signal IADD<1> having a logic high level.

The third flip flop 223 of the internal address generating unit 22 may generate the third internal address signal IADD<3> having a logic low level in response to the second internal address signal IADD<2> having a logic high level.

At a point of time T4, the controller 10 may output the update signal UPD including a pulse that has a logic high level.

At a point of time T5, the first flip flop 221 of the internal address generating unit 22 may generate the first internal address signal IADD<1> whose level is changed from a logic high level to a logic low level in response to the update signal UPD having a logic low level.

The second flip flop 222 of the internal address generating unit 22 may generate the second internal address signal IADD<2> whose level is changed from a logic high level to a logic low level in response to the first internal address signal IADD<1> having a logic low level.

The third flip flop 223 of the internal address generating unit 22 may generate the third internal address signal IADD<3> whose level is changed from a logic low level to a logic high level in response to the second internal address signal IADD<2> having a logic low level.

At a point of time T6, the controller 10 may output the update signal UPD including a pulse that has a logic high level.

At a point of time T7, the first flip flop 221 of the internal address generating unit 22 may generate the first internal address signal IADD<1> whose level is changed from a logic low level to a logic high level in response to the update signal UPD having a logic low level.

The second flip flop 222 of the internal address generating unit 22 may generate the second internal address signal IADD<2> having a logic low level in response to the first internal address signal IADD<1> having a logic high level.

The third flip flop 223 of the internal address generating unit 22 may generate the third internal address signal IADD<3> having a logic high level in response to the second internal address signal IADD<2> having a logic low level.

At a point of time T8, the controller 10 may output the update signal UPD including a pulse that has a logic high level.

At a point of time T9, the first flip flop 221 of the internal address generating unit 22 may generate the first internal address signal IADD<1> whose level is changed from a logic high level to a logic low level in response to the update signal UPD having a logic low level.

The second flip flop 222 of the internal address generating unit 22 may generate the second internal address signal IADD<2> whose level is changed from a logic low level to a logic high level in response to the first internal address signal IADD<1> having a logic low level.

The third flip flop 223 of the internal address generating unit 22 may generate the third internal address signal IADD<3> having a logic high level in response to the second internal address signal IADD<2> having a logic high level. In this instance, the first to third internal address signals IADD<1:3> may be counted until the first to third internal address signals IADD<1:3> has the same combination as the second combination of the first to third post-order address signals ADD2<1:3>.

At a point of time T10, the controller 10 may output the update signal UPD including a pulse that has a logic high level.

At a point of time T11, the comparison unit 211 of the code signal generating unit 21 may generate the reset signal RST having a logic high level because the combination of the first to third post-order address signals ADD2<1:3> having the second combination is the same as the combination of the first to third internal address signals IADD<1:3>.

The register 212 of the code signal generating unit 21 may output again the first to sixth code signals RC<1:6> in response to the reset signal RST having a logic high level.

The first flip flop 221 of the internal address generating unit 22 may receive the first code signal RC<1> having a logic high level and the second code signal RC<2> having a logic low level to generate the first internal address signal IADD<1> which is initialized to a logic low level.

The second flip flop 222 of the internal address generating unit 22 may receive the third code signal RC<3> having a logic low level and the fourth code signal RC<4> having a logic high level to generate the second internal address signal IADD<2> which is initialized to a logic high level.

The third flip flop 223 of the internal address generating unit 22 may receive the fifth code signal RC<5> having a logic high level and the sixth code signal RC<6> having a logic low level to generate the third internal address signal IADD<3> which is initialized to a logic low level.

As a result, the internal address generating unit 22 may generate the first to third internal address signals IADD<1:3> which are initialized to have the same combination as the first to third pre-order address signals ADD1<1:3> having the first combination, in response to the first to sixth code signals RC<1:6>.

In this instance, the first to third internal address signals IADD<1:3> may not be counted from a combination of the first to third internal address signals IADD<1:3>, all bits of which have a logic low level, to a combination of the first to third internal address signals IADD<1:3>, all bits of which have a logic high level, but may be counted from the first combination to the second combination.

As described above, the semiconductor system according to an embodiment may count the internal address signals by a predetermined number of times during the refresh operation. Thus, unnecessary counting operations may not be performed to reduce power consumption of the semiconductor system.

Figure 6:
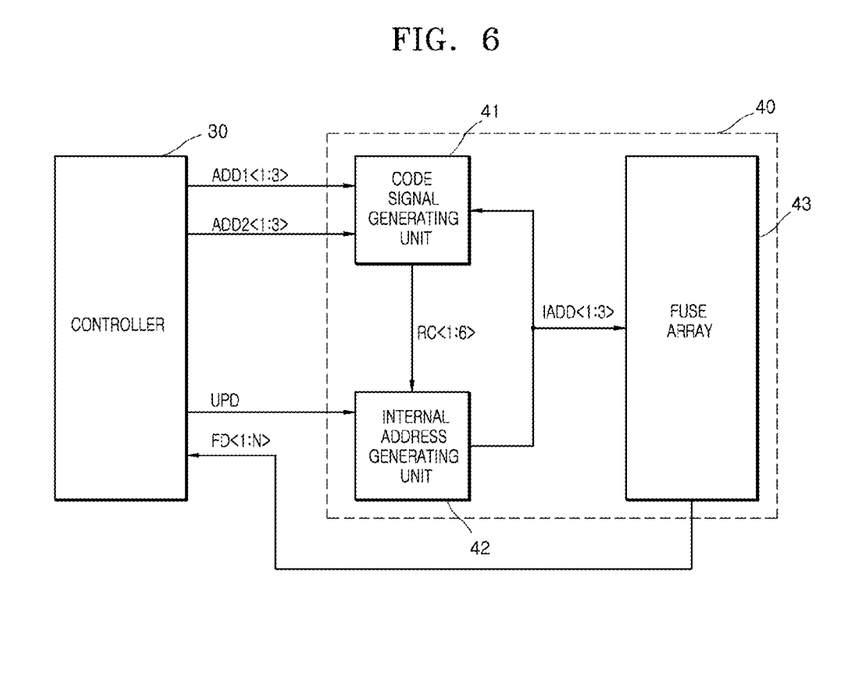
FIG. 6 is a block diagram illustrating a configuration of a semiconductor system according to an embodiment.

Referring to FIG. 6, a block diagram illustrating a configuration of a semiconductor system according to an embodiment is shown.

In FIG. 6, a semiconductor system according to an embodiment may include a controller 30 and a semiconductor device 40. The semiconductor device 40 may include a code signal generating unit 41, an internal address generating unit 42, and a fuse array 43.

The controller 30 may output first to third pre-order address signals ADD1<1:3>, first to third post-order address signals ADD2<1:3>, and an update signal UPD including a pulse which is periodically generated. In addition, the controller 30 may receive first to $N^{th}$ fuse data FD<1:N>. Although an embodiment is described in conjunction with an example in which the first to third pre-order address signals ADD1<1:3> are set to have three bits and the first to third post-order address signals ADD2<1:3> are set to have three bits, the invention is not limited thereto. In addition, although FIG. 6 illustrates an example in which the first to third pre-order address signals ADD1<1:3> and the first to third post-order address signals ADD2<1:3> are separately outputted from the controller 30 through different input/output (I/O) pins, the invention is not limited thereto. For example, the controller 30 may be designed so that the first to third pre-order address signals ADD1<1:3> and the first to third post-order address signals ADD2<1:3> are outputted in series through the same I/O pin.

The code signal generating unit 41 may output the first to sixth code signals RC<1:6> which are generated from the first to third pre-order address signals ADD1<1:3> and may output again the first to sixth code signals RC<1:6> if a combination of the first to third post-order address signals ADD2<1:3> is the same as a combination of first to third internal address signals IADD<1:3>.

The internal address generating unit 42 may generate the first to third internal address signals IADD<1:3> initialized to have a first combination according to a combination of the first to sixth code signals RC<1:6> and which are counted by a predetermined number of times in response to the pulse of the update signal UPD.

The fuse array 43 may include a plurality of fuse cells and may generate the first to $N^{th}$ fuse data FD<1:N> according to electrical open/short states of fuse cells which are selected by the first to third internal address signals IADD<1:3> during a boot-up operation. The number of bits of the first to $N^{th}$ fuse data FD<1:N> may be set to be different according to the embodiments. Further, the first to $N^{th}$ fuse data FD<1:N> may be set to be a parallel signal or a serial signal. In addition, the first to $N^{th}$ fuse data FD<1:N> may be set to include information necessary for various internal control operations of the semiconductor device 40, for example, setup information, repair information or the like.

An internal configuration of the semiconductor device 40 illustrated in FIG. 6 may be realized using substantially the same circuits as the semiconductor device 20 described with reference to FIGS. 1 to 4. Thus, detailed descriptions of the semiconductor device 40 will be omitted in the invention.

As describe above, the semiconductor system according to an other embodiment may generate the internal address signals counted by a predetermined number of times during the boot up operation. Thus, unnecessary counting operations may not be performed to reduce power consumption of the semiconductor system.

What is claimed is:

1. A semiconductor device comprising:
    a code signal generating circuit suitable for outputting code signals generated from pre-order address signals and for outputting again the code signals if a logic level combination of post-order address signals is a same logic level combination as internal address signals; and
    an internal address generating circuit suitable for generating the internal address signals initialized to have a first logic level combination according to a logic level combination of the code signals and counted from the first logic level combination by a predetermined number of times in response to a pulse of an update signal.

2. The semiconductor device of claim 1, wherein the internal address signals are counted from the first logic level combination until the internal address signals have a same logic level combination as a second logic level combination.

3. The semiconductor device of claim 1, wherein the internal address signals are initialized to have the first logic level combination which is a same logic level combination as the pre-order address signals.

4. The semiconductor device of claim 1, wherein the internal address signals are counted until the internal address signals have a second logic level combination which a same logic level combination as the post-order address signals.

5. The semiconductor device of claim 1, wherein the code signal generating circuit includes:
   a comparison circuit suitable for generating a reset signal which is enabled if a logic level combination of the post-order address signals is the same logic level combination as the internal address signals; and
   a register suitable for storing the pre-order address signals, for outputting the code signals which are generated from the pre-order address signals, and for outputting again the code signals in response to the reset signal.

6. The semiconductor device of claim 1,
   wherein the code signals include first to fourth code signals;
   wherein the internal address signals include a first internal address signal and a second internal address signal; and
   wherein the internal address generating circuit includes:
      a first flip flop suitable for generating the first internal address signal which is initialized according to a logic level combination of the first and second code signals and toggled in response to the pulse of the update signal; and
      a second flip flop suitable for generating the second internal address signal which is initialized according to a logic level combination of the third and fourth code signals and which is toggled in response to the first internal address signal.

7. The semiconductor device of claim 6, wherein the first flip flop includes:
   a first buffer circuit suitable for generating a first delay signal whose level is set according to a logic level combination of the first and second code signals, in response to the pulse of the update signal;
   a first transfer circuit suitable for outputting the first delay signal as a second delay signal in response to the pulse of the update signal; and
   a second buffer circuit suitable for latching and buffering the second delay signal in response to the pulse of the update signal to generate the first internal address signal.

8. The semiconductor device of claim 6, wherein the second flip flop includes:
   a third buffer circuit suitable for generating a third delay signal whose level is set according to a logic level combination of the third and fourth code signals, in response to the first internal address signal;
   a second transfer circuit suitable for outputting the third delay signal as a fourth delay signal in response to the first internal address signal; and
   a fourth buffer circuit suitable for suitable for latching and buffering the fourth delay signal in response to the first internal address signal to generate the second internal address signal.

9. The semiconductor device of claim 1, wherein internal address signals are counted a predetermined number of times during a refresh operation.

10. The semiconductor device of claim 1, wherein first to third internal address signals are counted from the first logic level combination to a second logic level combination.

11. The semiconductor device of claim 1, wherein first to third internal address signals are counted a predetermined number of times according to the update signal.

12. The semiconductor device of claim 1, wherein first to third internal address signals are generated according to first to sixth code signals.

13. The semiconductor device of claim 1, wherein first to third internal address signals are counted until having a same logic level combination as first to third post-order address signals.

14. The semiconductor device of claim 1, wherein first to third internal address signals are not counted from bits with a logic low level to bits with a logic high level.

15. The semiconductor device of claim 1, wherein first to third internal address signals are initialized to have a same logic level combination as first to sixth code signals.

16. The semiconductor device of claim 1, wherein a reset signal is generated when first to third internal address signals have a same logic level combination as first to third post-order address signals.

17. The semiconductor device of claim 16, further comprising:
   a comparison circuit configured to generate the reset signal at a specific time.

18. The semiconductor device of claim 1, wherein first to sixth code signals are generated from first to third pre-order address signals.

19. The semiconductor device of claim 18, wherein the code signal generating circuit may output the first to sixth code signals again if a logic level combination of first to third post-order address signals is a same logic level combination as first to third internal address signals.

20. A semiconductor system comprising:
   a controller suitable for outputting pre-order address signals and post-order address signals and for outputting an update signal including pulses which are periodically generated; and
   a semiconductor device suitable for generating internal address signals counted by a predetermined number of times according to a logic level combination of the pre-order address signals and a logic level combination of the post-order address signals in response to a pulse of the update signal and for performing a refresh operation according to a logic level combination of the internal address signals, wherein the semiconductor device include a code signal generating circuit suitable for outputting code signals generated from the pre-order address signals and for outputting again the code signals if a logic level combination of the post-order address signals is a same logic level combination as the internal address signals.

21. The system of claim 20, wherein the internal address signals are counted from a first logic level combination until the internal address signals have a second logic level combination.

22. The system of claim 20, wherein the internal address signals are initialized to have a first logic level combination which has a same logic level combination as the pre-order address signals.

23. The system of claim 22, wherein the internal address signals are counted until the internal address signals have a second logic level combination which is a same logic level combination as the post-order address signals.

24. The system of claim 20, wherein the semiconductor device includes:
   an internal address generating circuit suitable for generating the internal address signals which are initialized to have a first logic level combination according to a logic level combination of the code signals and which are counted by a predetermined number of times from the first logic level combination in response to the pulse of the update signal.

25. The system of claim 24, wherein the code signal generating circuit includes:
a comparison circuit suitable for generating a reset signal which is enabled if a logic level combination of the post-order address signals is the same logic level combination as the internal address signals; and
a register suitable for storing the pre-order address signals, for outputting the code signals which are generated from the pre-order address signals, and for outputting again the code signals in response to the reset signal.

26. The system of claim 24,
wherein the code signals include first to fourth code signals;
wherein the internal address signals include a first internal address signal and a second internal address signal; and
wherein the internal address generating circuit includes:
a first flip flop suitable for generating the first internal address signal which is initialized according to a logic level combination of the first and second code signals and which is toggled in response to the pulse of the update signal; and
a second flip flop suitable for generating the second internal address signal which is initialized according to a logic level combination of the third and fourth code signals and which is toggled in response to the first internal address signal.

27. The system of claim 26, wherein the first flip flop includes:
a first buffer circuit suitable for generating a first delay signal whose level is set according to a logic level combination of the first and second code signals, in response to the pulse of the update signal;
a first transfer circuit suitable for outputting the first delay signal as a second delay signal in response to the pulse of the update signal; and
a second buffer circuit suitable for suitable for latching and buffering the second delay signal in response to the pulse of the update signal to generate the first internal address signal.

28. The system of claim 26, wherein the second flip flop includes:
a third buffer circuit suitable for generating a third delay signal whose level is set according to a logic level combination of the third and fourth code signals, in response to the first internal address signal;
a second transfer circuit suitable for outputting the third delay signal as a fourth delay signal in response to the first internal address signal; and
a fourth buffer circuit suitable for latching and buffering the fourth delay signal in response to the first internal address signal to generate the second internal address signal.

29. The system of claim 24,
wherein the semiconductor device further includes a memory array that has a plurality of memory cells; and
wherein some of the memory cells are selected and refreshed by a logic level combination of the internal address signals.

30. The system of claim 24,
wherein the semiconductor device further includes a fuse array that has a plurality of fuse cells; and
wherein the fuse array is suitable for generating fuse data according to electrical open/short states of the fuse cells which are selected by the logic level combination of the internal address signals.

31. A semiconductor system comprising:
a controller suitable for outputting pre-order address signals, post-order address signals, and an update signal having pulses periodically generated and for receiving fuse data; and
a semiconductor device suitable for generating internal address signals counted by a predetermined number of times according to a logic level combination of the pre-order address signals and a logic level combination of the post-order address signals in response to a pulse of the update signal and for outputting the fuse data according to a logic level combination of the internal address signals, wherein the semiconductor device include a code signal generating circuit suitable for outputting code signals generated from the pre-order address signals and for outputting again the code signals if a logic level combination of the post-order address signals is a same logic level combination as the internal address signals.

* * * * *